(12) United States Patent
Bogdanov et al.

(10) Patent No.: US 7,427,861 B2
(45) Date of Patent: Sep. 23, 2008

(54) DUAL-TUNED MICROSTRIP RESONATOR VOLUME COIL

(75) Inventors: Gene Bogdanov, Manchester, CT (US); Reinhold Ludwig, Paxton, MA (US); Craig Ferris, Holden, MA (US)

(73) Assignee: Insight Neuroimaging Systems, LLC, Worcester, MA (US)

( * ) Notice: Subject to any disclaimer, the term of this patent is extended or adjusted under 35 U.S.C. 154(b) by 0 days.

(21) Appl. No.: 11/403,205

(22) Filed: Apr. 11, 2006

(65) Prior Publication Data

US 2006/0250125 A1    Nov. 9, 2006

Related U.S. Application Data

(60) Provisional application No. 60/670,605, filed on Apr. 11, 2005.

(51) Int. Cl.
*G01V 3/00* (2006.01)
(52) U.S. Cl. .................. 324/318; 324/318; 324/322
(58) Field of Classification Search ......... 324/300–322; 600/407–445
See application file for complete search history.

(56) References Cited

U.S. PATENT DOCUMENTS

| | | | |
|---|---|---|---|
| 5,168,230 A * | 12/1992 | Hashoian et al. ............ 324/318 |
| 5,194,811 A | 3/1993 | Murphy-Boesch et al. |
| 5,202,635 A | 4/1993 | Srinivasan et al. |
| 5,557,247 A | 9/1996 | Vaughn, Jr. |
| 5,680,047 A * | 10/1997 | Srinivasan et al. .......... 324/318 |
| 6,150,816 A * | 11/2000 | Srinivasan ................. 324/318 |
| 6,369,570 B1 | 4/2002 | Wong et al. |
| 6,396,271 B1 | 5/2002 | Burl et al. |
| 6,420,871 B1 | 7/2002 | Wong et al. |
| 6,522,143 B1 * | 2/2003 | Fujita et al. ................. 324/318 |
| 6,633,161 B1 | 10/2003 | Vaughan, Jr. |
| 6,711,430 B1 | 3/2004 | Ferris et al. |
| 6,847,210 B1 * | 1/2005 | Eydelman et al. ........... 324/318 |
| 6,995,561 B2 * | 2/2006 | Boskamp et al. ............ 324/318 |
| 7,023,209 B2 * | 4/2006 | Zhang et al. ................ 324/318 |
| 7,132,829 B2 * | 11/2006 | Hudson et al. .............. 324/318 |
| 7,202,668 B2 * | 4/2007 | Ludwig et al. .............. 324/318 |
| 7,215,120 B2 * | 5/2007 | Vaughan .................... 324/318 |
| 2003/0146750 A1 | 8/2003 | Vaughan |
| 2006/0158191 A1 | 7/2006 | Ludwig et al. |

* cited by examiner

*Primary Examiner*—Brij B Shrivastav
(74) *Attorney, Agent, or Firm*—Leason Ellis LLP

(57) ABSTRACT

A dual-tuned volume coil for performing MR imaging according to one embodiment includes an inner cylinder having a first coil structure disposed on an inner surface thereof and a second coil structure disposed on an outer surface thereof. The first coil structure operates at a first resonance frequency and the second coil structure operates at a second resonance frequency. The volume coil includes an outer shield disposed about the inner cylinder, with the first and second coil structure being connected to the outer shield by means of a plurality of capacitors.

14 Claims, 13 Drawing Sheets

DUAL-TUNED MICROSTRIP RESONATOR VOLUME COIL

CROSS REFERENCE TO RELATED APPLICATIONS

The present application claims the benefit of U.S. patent application Ser. No. 60/670,605, filed Apr. 11, 2005, which is hereby incorporated by reference in its entirety. The present application is also related to and incorporates by reference in its entirety, International Patent Application No. PCT/US2004/027532, entitled MICROSTRIP COIL DESIGN FOR MRI APPARATUS, filed on Aug. 23, 2004 and published as WO 2005/020793 A2 on Mar. 10, 2005.

BACKGROUND

Microstrip radio frequency (RF) transmission line coil technology for magnetic resonance (MR) imaging developed by Insight Neuroimaging Systems, LLC (the assignee of the present application) has been successfully applied to a diverse set of magnet systems, ranging from 3 T human to 11.7 T animal scanners. The coils have been developed for linear and quadrature mode of operation and can function in combination with separate receiver coils.

In conventional MR imaging applications, the RF coils are tuned to the hydrogen ($^1H$) resonance frequency determined by the main magnet field strength. Depending on the biomedical application, however, it may prove desirable to extend the RF coil capabilities beyond proton resonance imaging. For instance, by tuning to other atom resonance frequencies such as phosphorous, fluoride, or carbon, the range of applications for the RF coils can be significantly extended.

SUMMARY

A dual-tuned volume coil for performing MR imaging according to one embodiment includes an inner cylinder having a first coil structure disposed on an inner surface thereof and a second coil structure disposed on an outer surface thereof. The first coil structure operates at a first resonance frequency and the second coil structure operates at a second resonance frequency. The volume coil includes an outer shield disposed about the inner cylinder, with the first and second coil structure being connected to the outer shield by means of a plurality of capacitors.

A dual-tuned volume coil includes a single inner coil structure having a plurality of microstrips that operate at two different resonance frequencies to provide two imaging modes and an outer shield that is electrically coupled to the inner coil structure. The widths of the microstrips vary as a function of their location about the coil.

BRIEF DESCRIPTION OF THE DRAWING FIGURES

The foregoing and other features of the present invention will be more readily apparent from the following detailed description and drawings of the illustrative embodiments of the invention where like reference numbers refer to similar elements and in which.

DETAILED DESCRIPTION

In an exemplary embodiment, the present invention provides a dual-tuned RF transmit/receive coil 100 for MR imaging that has the ability to tune selectively to two separate resonance frequencies.

Figure 1A:
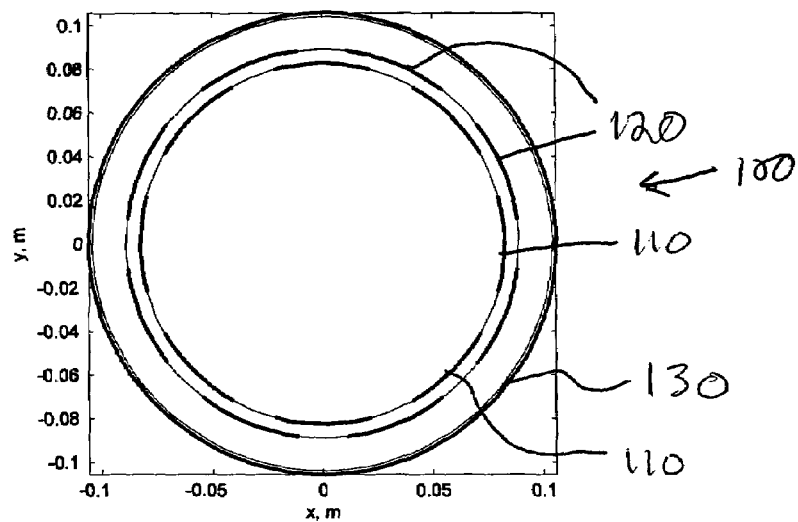
FIG. 1A is a cross-sectional view of a dual-tuned resonator volume coil according to one exemplary embodiment of the present invention.
Figure 1B:
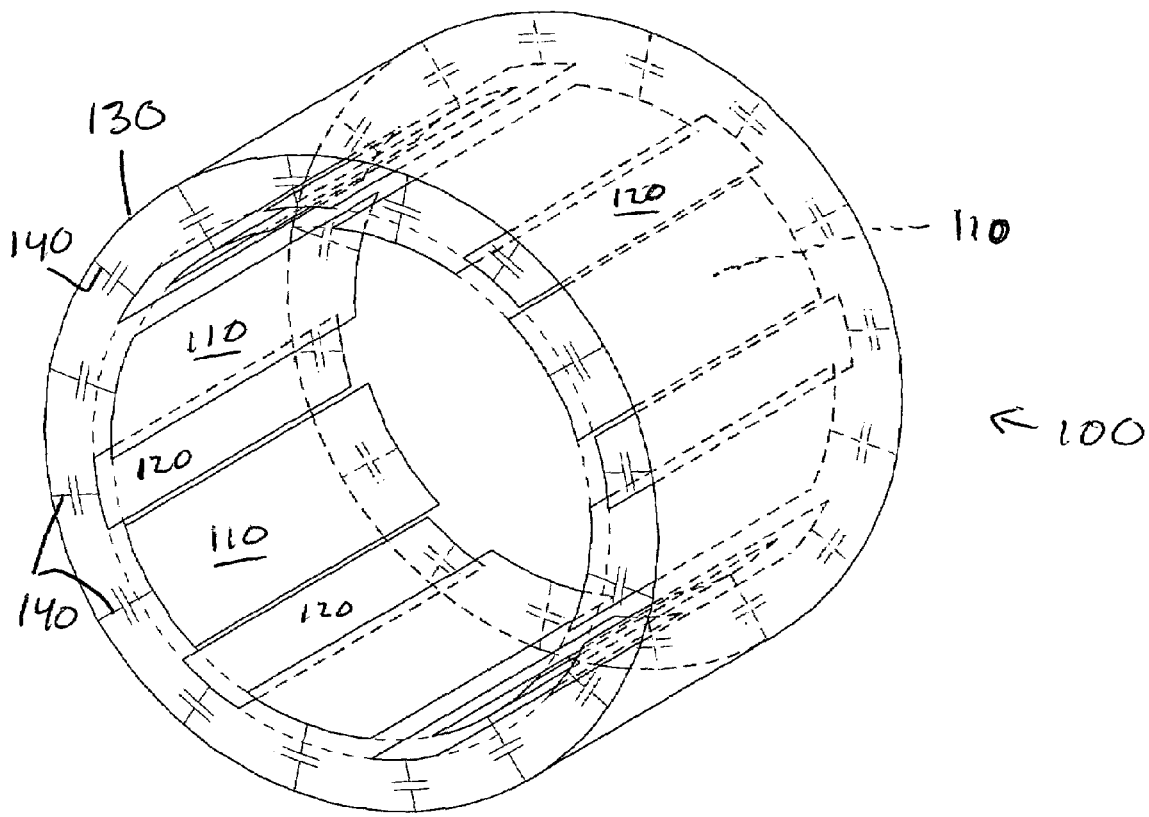
FIG. 1B is a perspective view of the dual-tuned resonator volume coil according to FIG. 1A.

The present invention relates to resonator volume coils 110, 120 that enable imaging at two different resonance frequencies. In a first exemplary embodiment, two widely spaced resonance frequencies, such as 170 MHz ($^1$H imaging at 4 Tesla) and 40 MHz ($^{13}$C imaging at 4 Tesla) are achieved using two separate coil structures 110, 120 placed on the inner and outer surfaces, respectively, of an inner cylinder and connected to an outer cylindrical shield 130 via fixed and/or variable tuning capacitors 140. FIGS. 1A and 1B show cross-sectional and perspective views, respectively, of such an embodiment. The aforementioned capacitors 140 can be seen in FIG. 1B.

Several variants of the exemplary two-layer coil 100 of FIGS. 1A and 1B are possible in accordance with the present invention and are referred to herein as variants I, II and III. In a first variant, variant I, the inner coil 110 of the two-layer coil is the lower frequency coil. In variant II, the inner coil 110 is the higher frequency coil and in variant III, the inner coil 110 is the lower frequency coil and extends beyond the outer coil 120.

Figure 12A:
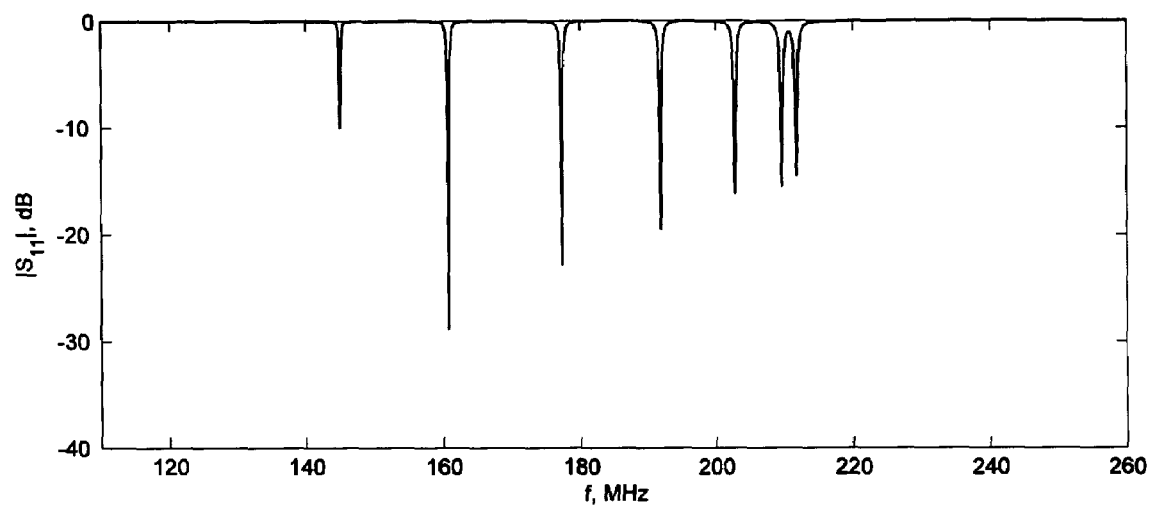
FIG. 12A shows a reflection coefficient ($S_{11}$) as a function of frequency for a reference volume coil operating at a lower frequency of operation.
Figure 12B:
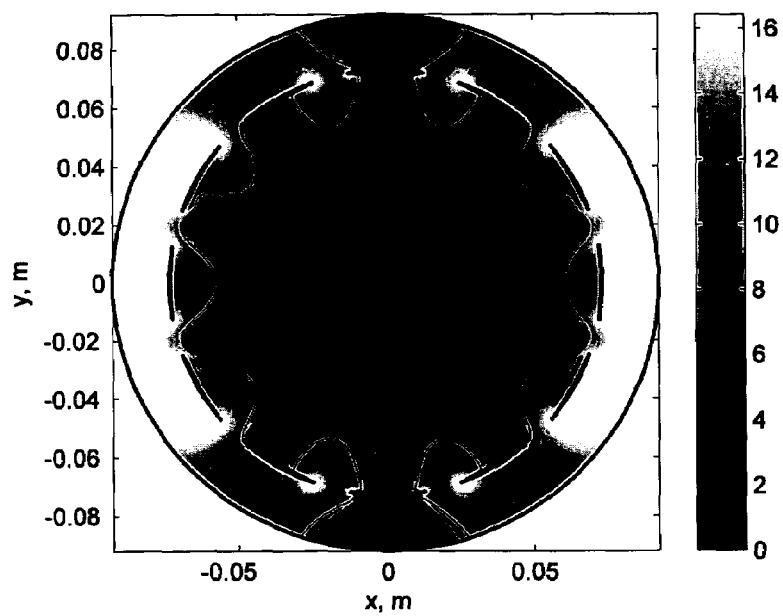
FIG. 12B shows the $B_1$ field behavior for the reference volume coil at the lower frequency of operation.
Figure 13A:
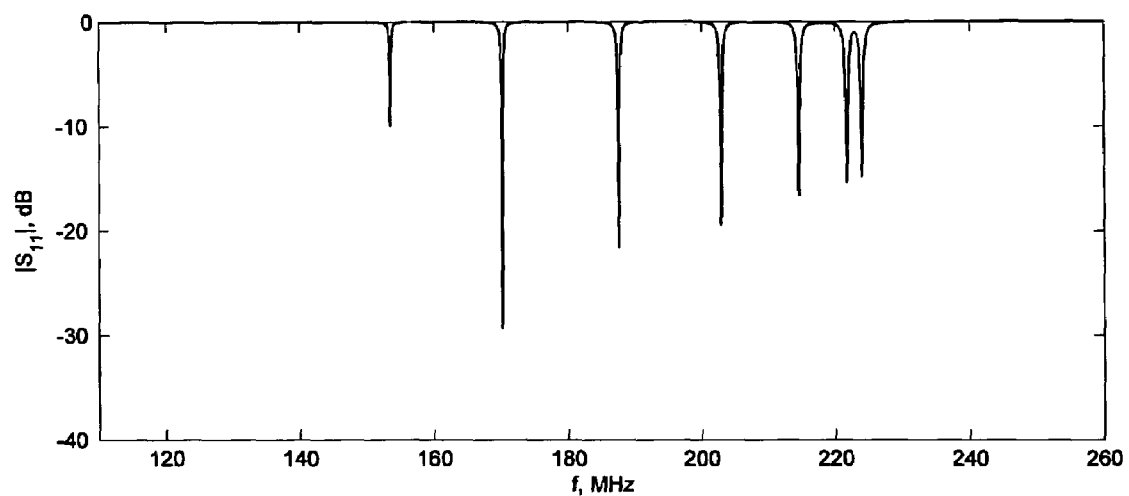
FIG. 13A shows a reflection coefficient ($S_{11}$) as a function of frequency for reference volume coil at a higher frequency of operation.
Figure 13B:
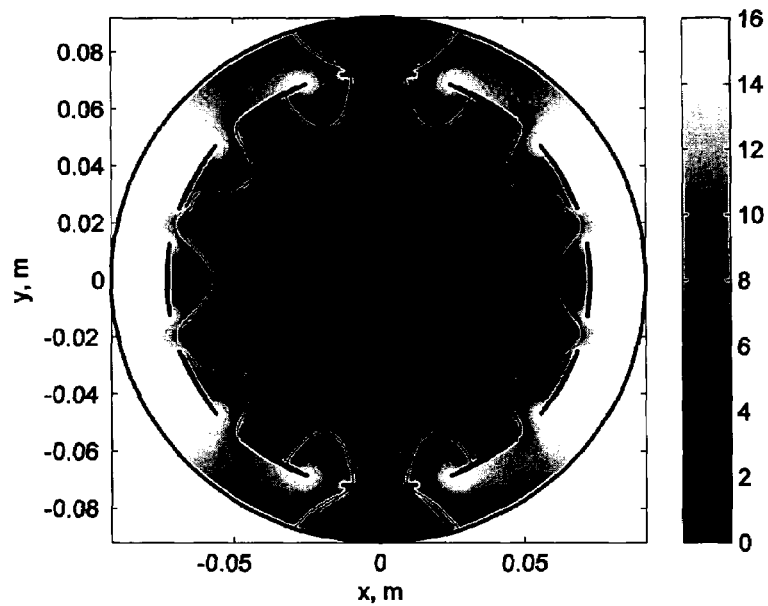
FIG. 13B shows the $B_1$ field behavior for the reference volume coil at the higher frequency of operation.

Simulations were conducted to compare the field linearity performance of the exemplary, two-layer coil 100 of the present invention to that of a conventional, single-layer microstrip coil, referred to as the "reference coil" and shown schematically in cross-section in FIGS. 8B and 9B and again in FIGS. 12B and 13B.

An exemplary embodiment of coil 100 according to the present invention has the following parameters:

Shield Support Cylinder
  OD=8.313 in (211 mm)
  ID=8.188 in (208 mm)
  Wall thickness=0.063 in (1.6 mm)
  Material=acrylic Coil Support Cylinder
  OD=7 in (178 mm) (location of outer coil)
  ID=6.5 in (165 mm) (location of inner coil)
  Wall thickness=0.25 in (6.4 mm)
  Material=acrylic Coil length=5 in (127 mm)

Number of strips=8 per layer (2 layers)

Using "optimal" strip width for single-layer coils (a function of ID/OD):
  Relative strip width=66.7% of center-to-center spacing
  Inner coil strip width=1.701 in (43 mm)
  Outer coil strips width=1.833 in (47 mm)

Outer coil is rotated 22.5° with respect to the inner coil.

Operating frequencies for the coil 100 in accordance with one embodiment of the present invention:
  $f_{low}$=40.8 MHz
  $f_{high}$=170.2 MHz Table I summarizes the results of the simulations for the three variants of coil 100 and the reference coil implementations.

TABLE I

| | | Lower frequency | | | | Higher frequency | | |
|---|---|---|---|---|---|---|---|---|
| Coil Type | Q | $B_1$ (linear), $\mu T/\sqrt{W}$ | Normalized $B_1$, $\mu T/\sqrt{Q \cdot W}$ | Mode separation | Q | $B_1$ (linear), $\mu T/\sqrt{W}$ | Normalized $B_1$, $\mu T/\sqrt{Q \cdot W}$ | Mode separation |
| Variant I: Dual coil, inner coil is the low frequency coil | 396 | 6.61 | 0.332 | 14.5% | 320 | 0.517 | 0.0289 | 1.3% |
| Variant II: Dual coil, inner coil is the high frequency coil | 326 | 4.53 | 0.251 | 11.5% | 328 | 2.08 | 0.115 | 4.5% |
| Variant III: Dual coil, inner coil is the low frequency coil and extends beyond outer coil | 432 | 6.35 | 0.305 | 13.2% | 464 | 0.842 | 0.0391 | 27.1% |
| Reference design (single coil) | 433 | 7.30 | 0.351 | 9.5% | 699 | 4.61 | 0.174 | 9.4% |

Exemplary embodiments of the aforementioned variants will now be described in greater detail.

An exemplary embodiment of Variant I, in which the lower frequency coil is on the inside 110, has the following capacitor values:
  $C_{low}$=651 pF
  $C_{high}$=65.1 pF For the lower frequency (e.g., 40.8 MHz) operation of this embodiment:
  Q=396

B1=6.61 uT/sqrt(W)
B1(Q-normalized)=0.332 uT/sqrt(Q*W)
Mode separation=14.5%

Figure 2A:
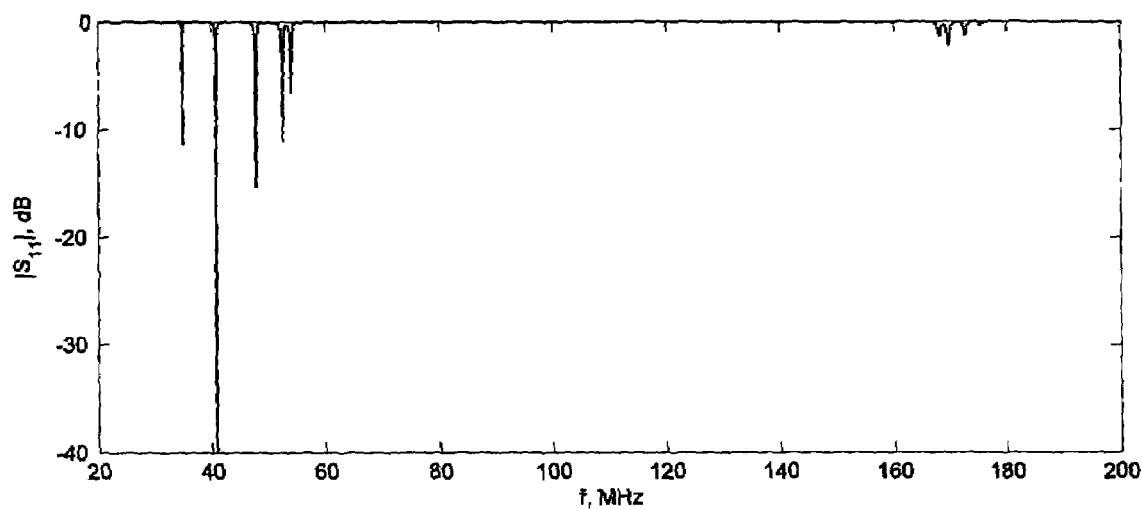
FIG. 2A shows a reflection coefficient ($S_{11}$) as a function of frequency for a dual-tuned resonator volume coil in accordance with a first embodiment of the present invention and at a lower frequency of operation.

FIG. 2A shows the reflection coefficient ($S_{11}$) as a function of frequency for this embodiment, at the lower frequency of operation.

Figure 2B:
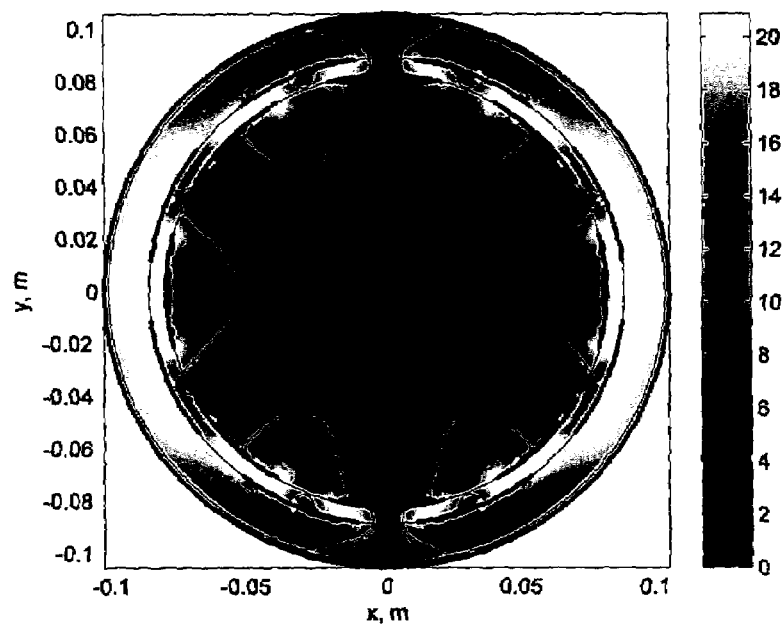
FIG. 2B shows the $B_1$ field behavior for the dual-tuned resonator volume coil in accordance with the first embodiment, at the lower frequency of operation.

FIG. 2B shows the $B_1$ field behavior (black contour: ±1 dB boundary) for the same embodiment, at the lower frequency of operation.

For the higher frequency (e.g., 170.2 MHz) of operation of this embodiment:
Q=320
B1=0.517 uT/sqrt(W)
B1(Q-normalized)=~0.0289 uT/sqrt(Q*W)
Mode separation=1.3%

Figure 3A:
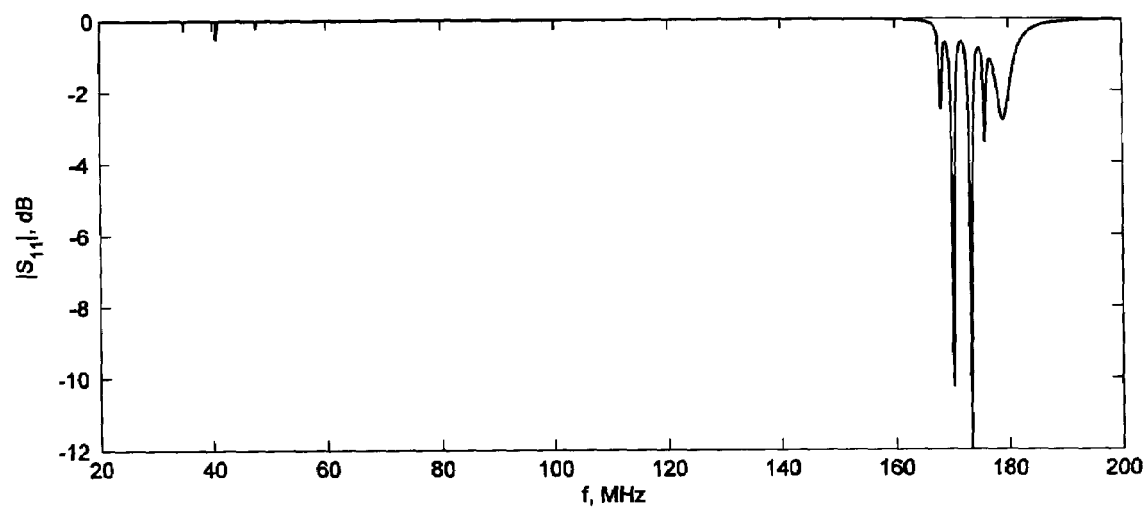
FIG. 3A shows a reflection coefficient ($S_{11}$) as a function of frequency for the dual-tuned resonator volume coil in accordance with the first embodiment of the present invention and at a higher frequency of operation.
Figure 3B:
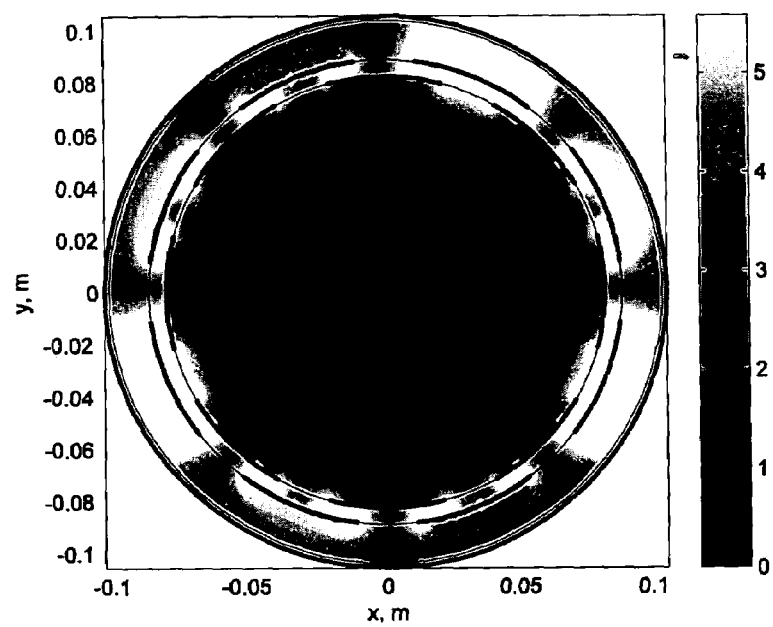
FIG. 3B shows the $B_1$ field behavior for the dual-tuned resonator volume coil in accordance with the first embodiment, at the higher frequency of operation.

FIG. 3A shows the reflection coefficient ($S_{11}$) as a function of frequency for this embodiment, at the higher frequency of operation FIG. 3B shows the $B_1$ field behavior (black contour: ±1 dB boundary) for the same embodiment, at the higher frequency of operation.

An exemplary embodiment of Variant II, in which the higher frequency coil is on the inside 110, has the following capacitor values:
$C_{low}$=798.7 pF
$C_{high}$=52.2 pF For the lower frequency (e.g., 40.8 MHz) of operation of this embodiment:
Q=326
B1=4.53 uT/sqrt(W)
B1(Q-normalized)=0.251 uT/sqrt(Q*W)
Mode separation=11.5%

Figure 4A:
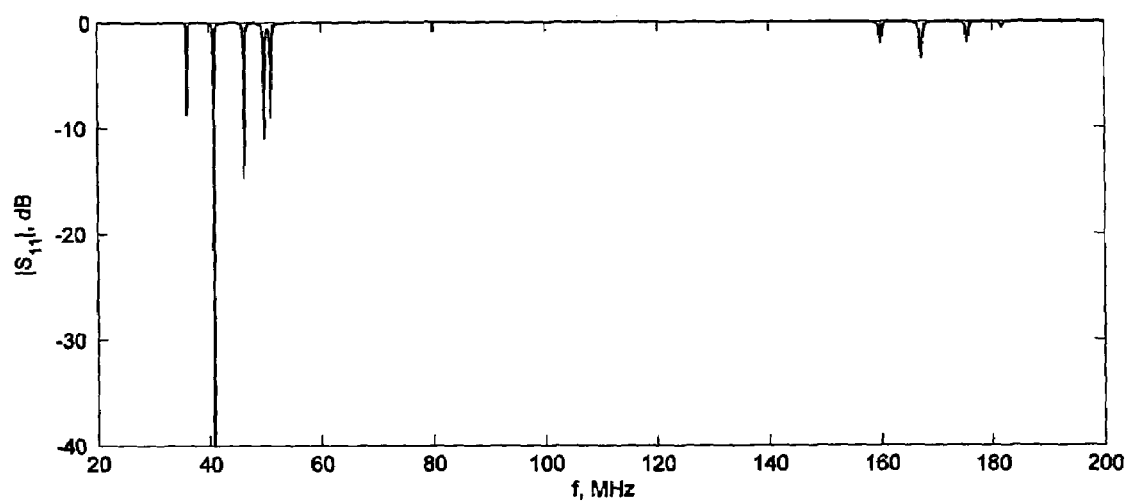
FIG. 4A shows a reflection coefficient ($S_{11}$) as a function of frequency for a dual-tuned resonator volume coil in accordance with a second embodiment of the present invention and at a lower frequency of operation.
Figure 4B:
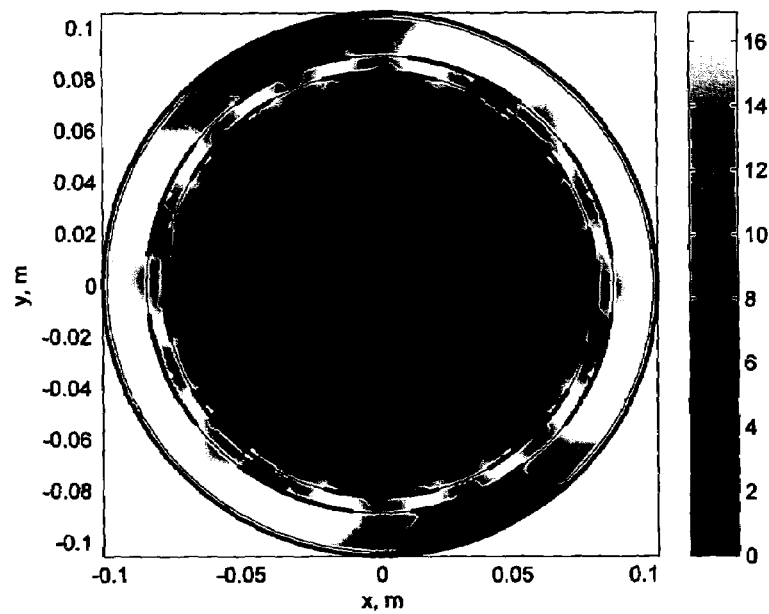
FIG. 4B shows the $B_1$ field behavior for the dual-tuned resonator volume coil in accordance with the second embodiment, at the lower frequency of operation.

FIG. 4A shows the reflection coefficient ($S_{11}$) as a function of frequency for this embodiment, at the lower frequency of operation FIG. 4B shows the $B_1$ field behavior (black contour: ±1 dB boundary) for the same embodiment, at the lower frequency of operation.

For the higher frequency (e.g., 170.2 MHz) of operation of this embodiment:
Q=328
B1=2.08 uT/sqrt(W)
B1(Q-normalized)=0.115 uT/sqrt(Q*W)
Mode separation=4.5%

Figure 5A:
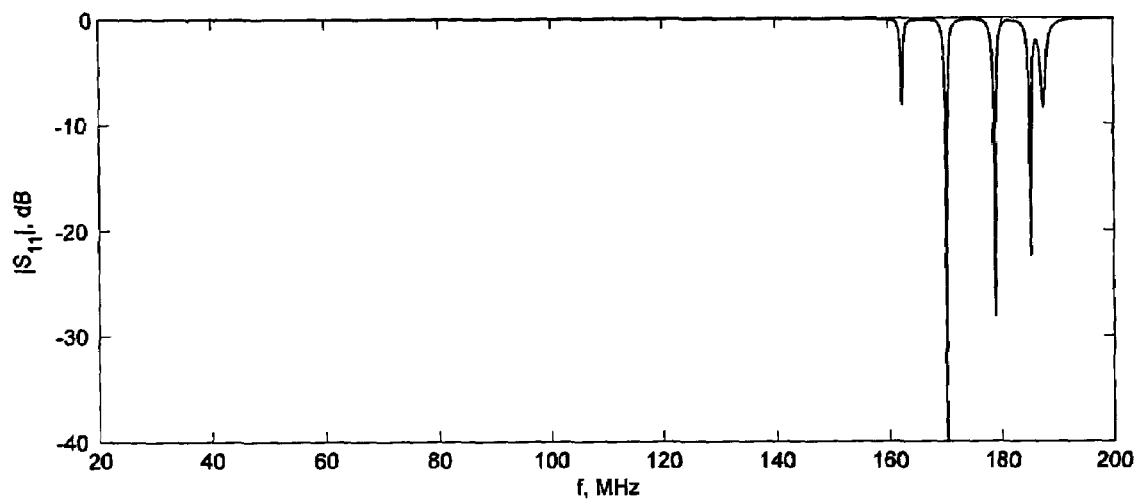
FIG. 5A shows a reflection coefficient ($S_{11}$) as a function of frequency for the dual-tuned resonator volume coil in accordance with the second embodiment of the present invention and at a higher frequency of operation.
Figure 5B:
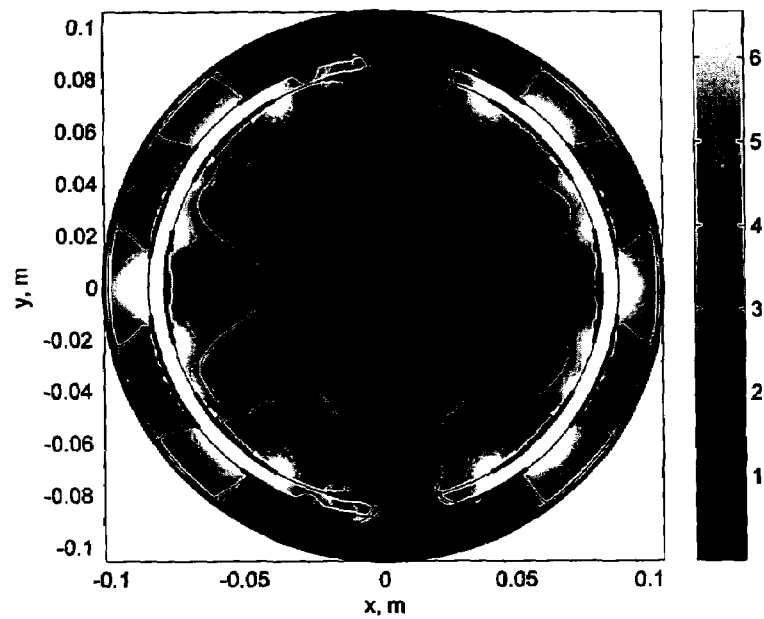
FIG. 5B shows the $B_1$ field behavior for the dual-tuned resonator volume coil in accordance with the second embodiment, at the higher frequency of operation.

FIG. 5A shows the reflection coefficient ($S_{11}$) as a function of frequency for this embodiment, at the higher frequency of operation FIG. 5B shows the $B_1$ field behavior (black contour: ±1 dB boundary) for the same embodiment, at the higher frequency of operation.

An exemplary embodiment of Variant III, in which the lower frequency coil is on the inside 110 and the inner coil 110 extends beyond the outer coil 120, has the following capacitor values:
$C_{low}$=554 pF
$C_{high}$=67.2 pF In this exemplary embodiment, the microstrips of the inner coil 110 extend by 0.5" beyond both ends of the outer coil 120 for a total length of 6".

For the lower frequency (e.g., 40.8 MHz) of operation of this embodiment:
Q=432
B1=6.35 uT/sqrt(W)
B1(Q-normalized)=0.305 uT/sqrt(Q*W)
Mode separation: 13.2%

Figure 6A:
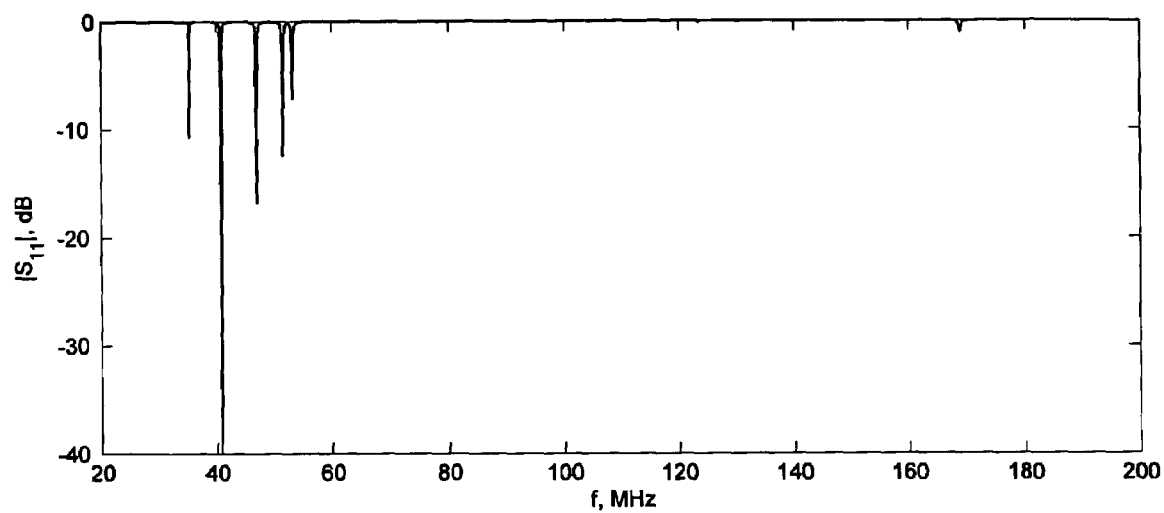
FIG. 6A shows a reflection coefficient ($S_{11}$) as a function of frequency for a dual-tuned resonator volume coil in accordance with a third embodiment of the present invention and at a lower frequency of operation.
Figure 6B:
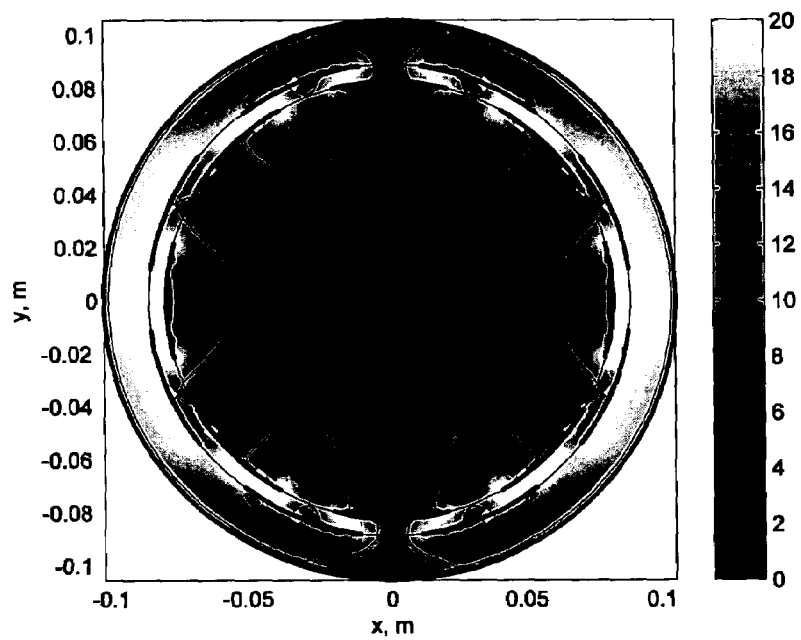
FIG. 6B shows the $B_1$ field behavior for the dual-tuned resonator volume coil in accordance with the third embodiment, at the lower frequency of operation.

FIG. 6A shows the reflection coefficient ($S_{11}$) as a function of frequency for this embodiment, at the lower frequency of operation FIG. 6B shows the $B_1$ field behavior (black contour: ±1 dB boundary) for the same embodiment, at the lower frequency of operation.

For the higher frequency (e.g., 170.2 MHz) of operation of this embodiment:
Q=464
B1=0.842 uT/sqrt(W)
B1(Q-normalized)=0.0391 uT/sqrt(Q*W)
Mode separation=27.1%

Figure 7A:
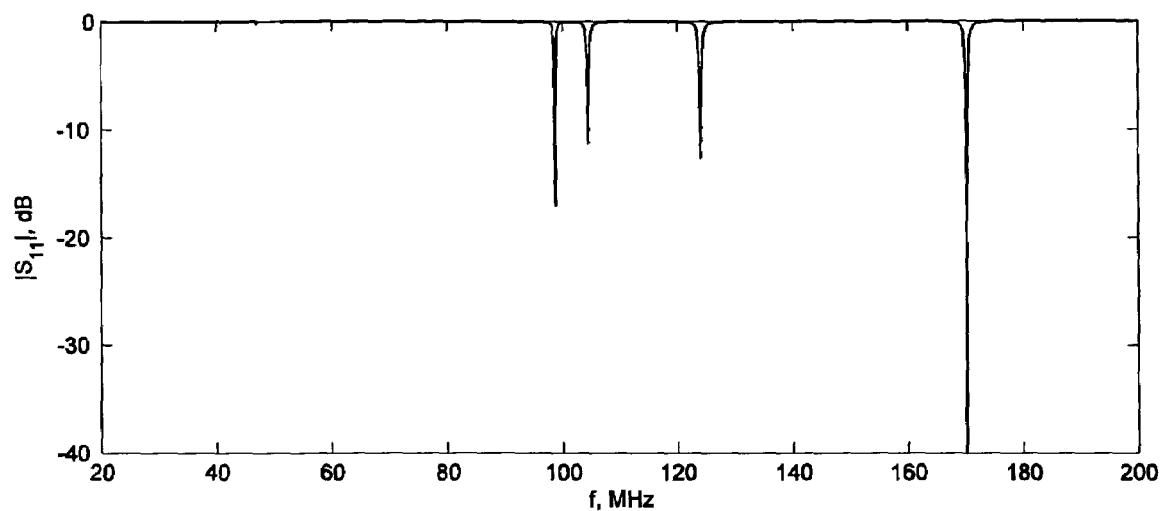
FIG. 7A shows a reflection coefficient ($S_{11}$) as a function of frequency for the dual-tuned resonator volume coil in accordance with the third embodiment of the present invention and at a higher frequency of operation.

FIG. 7A shows the reflection coefficient ($S_{11}$) as a function of frequency for this embodiment, at the higher frequency of operation.

Figure 7B:
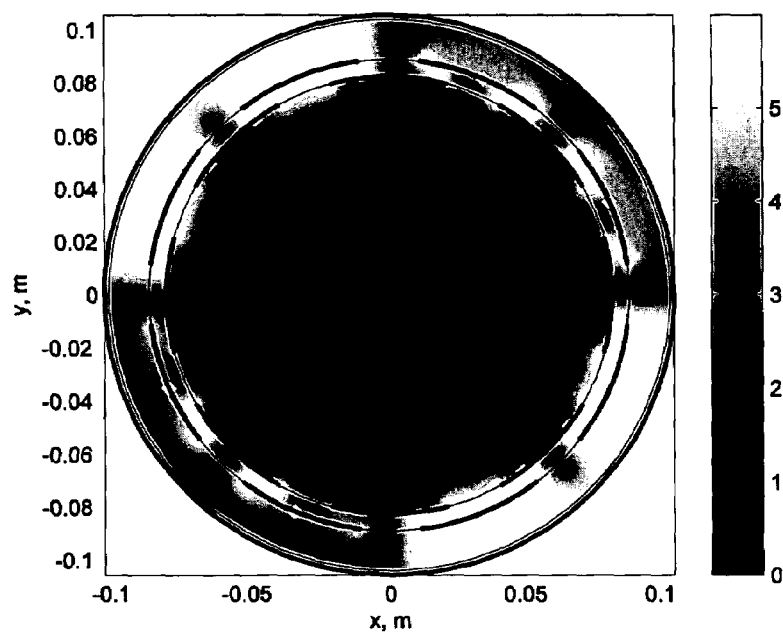
FIG. 7B shows the $B_1$ field behavior for the dual-tuned resonator volume coil in accordance with the third embodiment, at the higher frequency of operation.

FIG. 7B shows the $B_1$ field behavior (black contour: ±1 dB boundary) for the same embodiment, at the higher frequency of operation.

For comparison, the performance of the reference coil will now be described.

For the lower frequency (e.g., 40.8 MHz) of operation, the value of the capacitors used is 598 pF, and the resultant parameters are:
Q=433
B1=7.30 uT/sqrt(W)
B1(Q-normalized)=0.351 uT/sqrt(Q*W)
Mode separation=9.5%

Figure 8A:
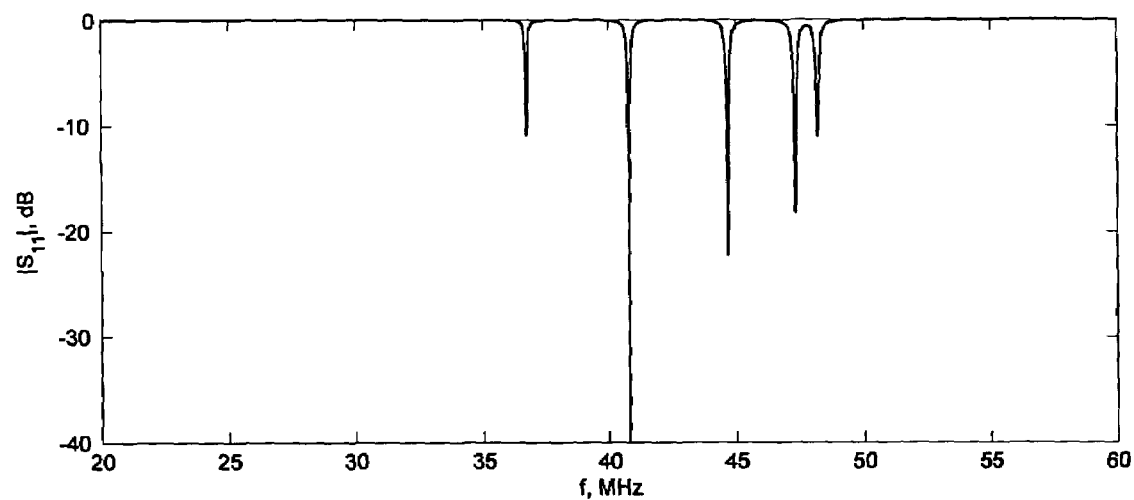
FIG. 8A shows a reflection coefficient ($S_{11}$) as a function of frequency for a reference volume coil operating at a lower frequency of operation.
Figure 8B:
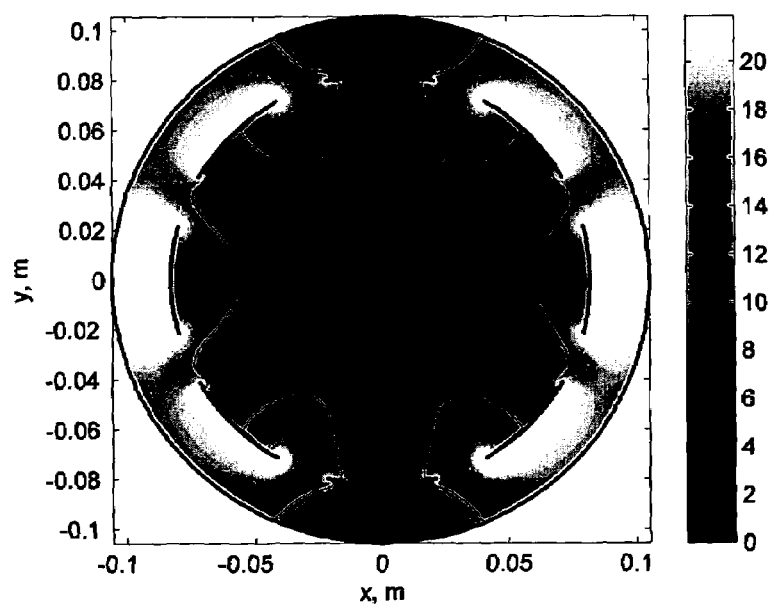
FIG. 8B shows the $B_1$ field behavior for the reference volume coil at the lower frequency of operation.

FIG. 8A shows the reflection coefficient ($S_{11}$) as a function of frequency for the reference coil operating at the lower frequency of operation, whereas FIG. 8B shows the $B_1$ field behavior.

For the higher frequency (e.g., 170.2 MHz) of operation, the value of the capacitors used is 33.3 pF, and the resultant parameters are:
Q=699
B1=4.61 uT/sqrt(W)
B1(Q-normalized)=0.174 uT/sqrt(Q*W)
Mode separation=9.4%

Figure 9A:
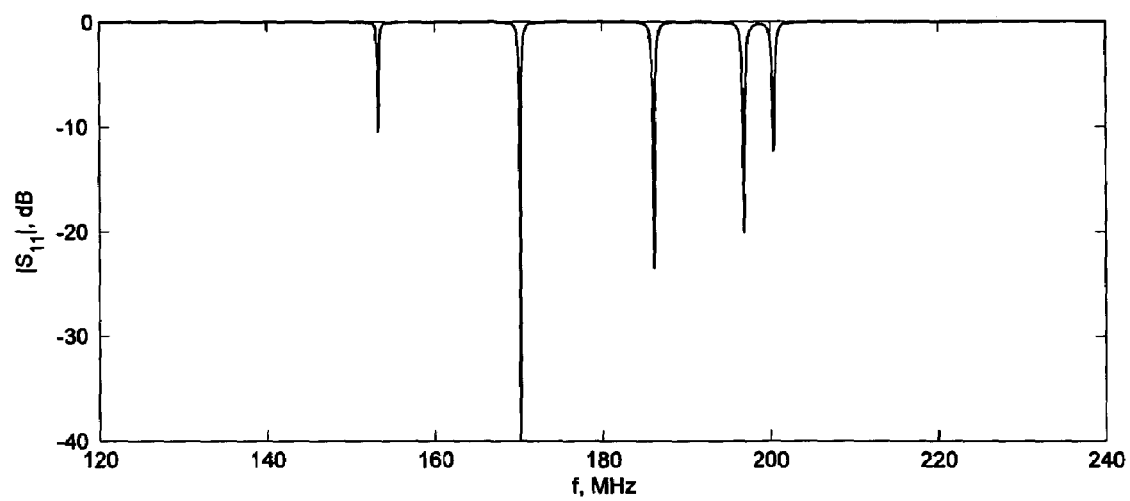
FIG. 9A shows a reflection coefficient ($S_{11}$) as a function of frequency for reference volume coil at a higher frequency of operation.
Figure 9B:
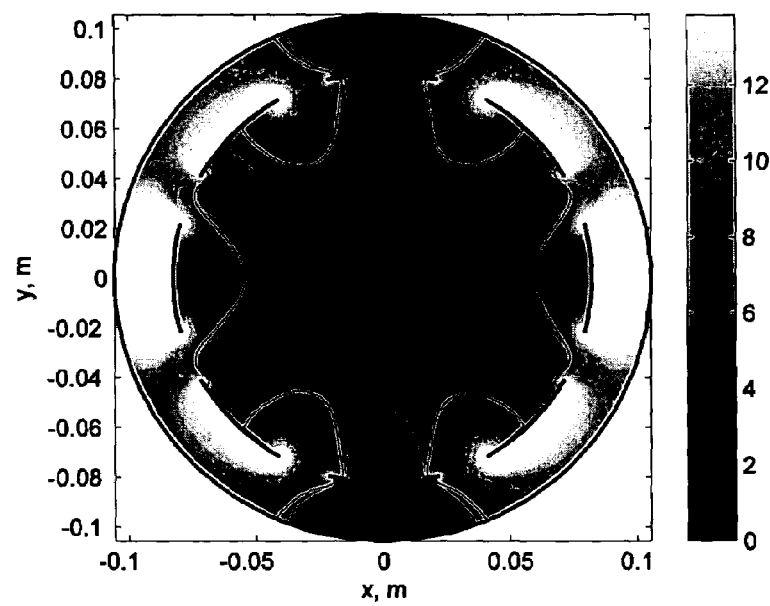
FIG. 9B shows the $B_1$ field behavior for the reference volume coil at the higher frequency of operation.

FIG. 9A shows the reflection coefficient ($S_{11}$) as a function of frequency for the reference coil operating at the higher frequency of operation, whereas FIG. 9B shows the $B_1$ field behavior.

In yet a further exemplary embodiment in accordance with the present invention, a single coil is provided having relatively closely spaced resonances frequencies, such as, for example 170 MHz ($^1$H at 4 T) and 160 MHz ($^{19}$F at 4 T). In this embodiment, the two imaging modes (typically degenerate, used in quadrature) are moved to two different frequencies. An advantage is that the modes are orthogonal, and thus decoupled, while homogeneity and efficiency are preserved. It is noted that this coil configuration can be used at linear-only modes of operation for both frequencies.

Figure 10A:
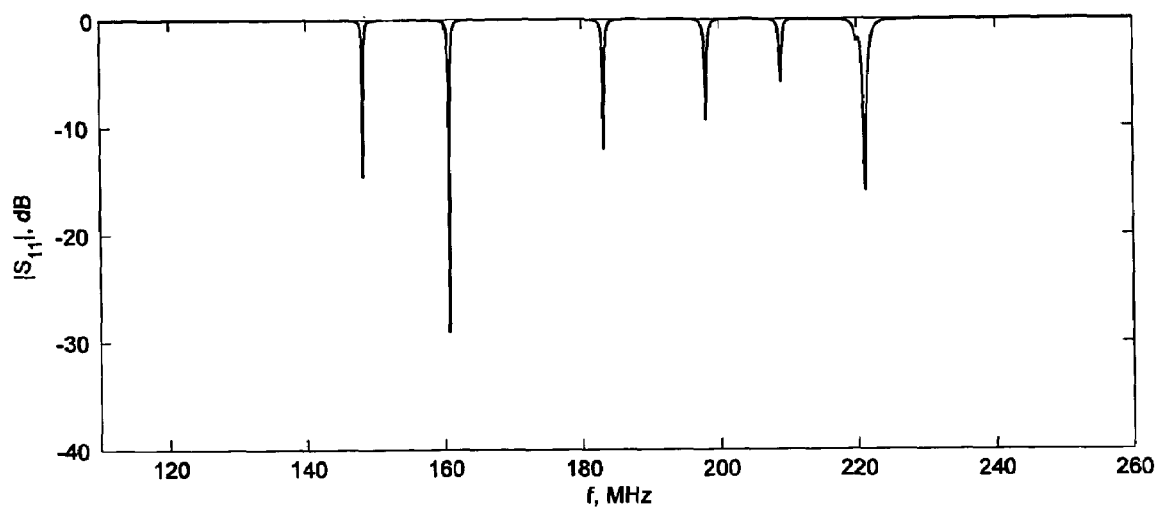
FIG. 10A shows a reflection coefficient ($S_{11}$) as a function of frequency for a dual-tuned, single layer resonator volume coil in accordance with a fourth embodiment of the present invention and at a lower frequency of operation.
Figure 10B:
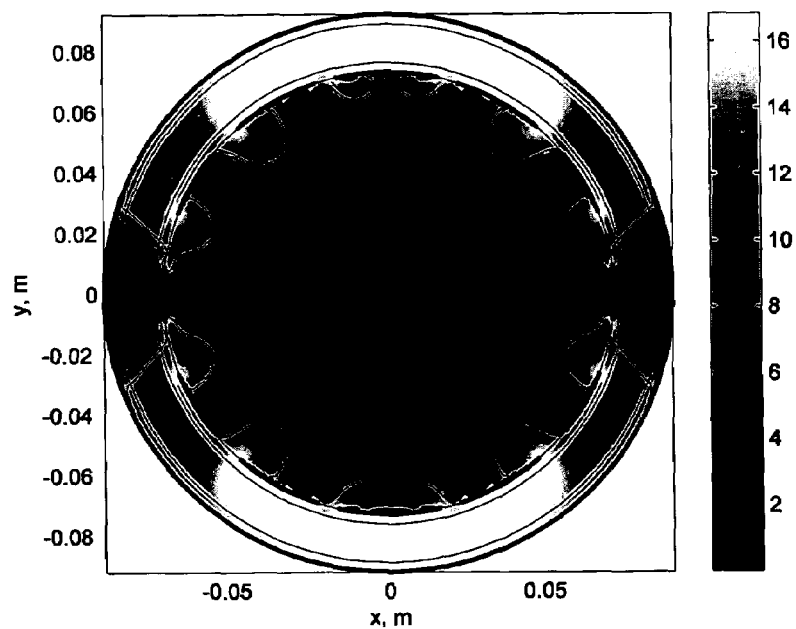
FIG. 10B shows the $B_1$ field behavior for the dual-tuned, single layer resonator volume coil in accordance with the fourth embodiment, at the lower frequency of operation.
Figure 11A:
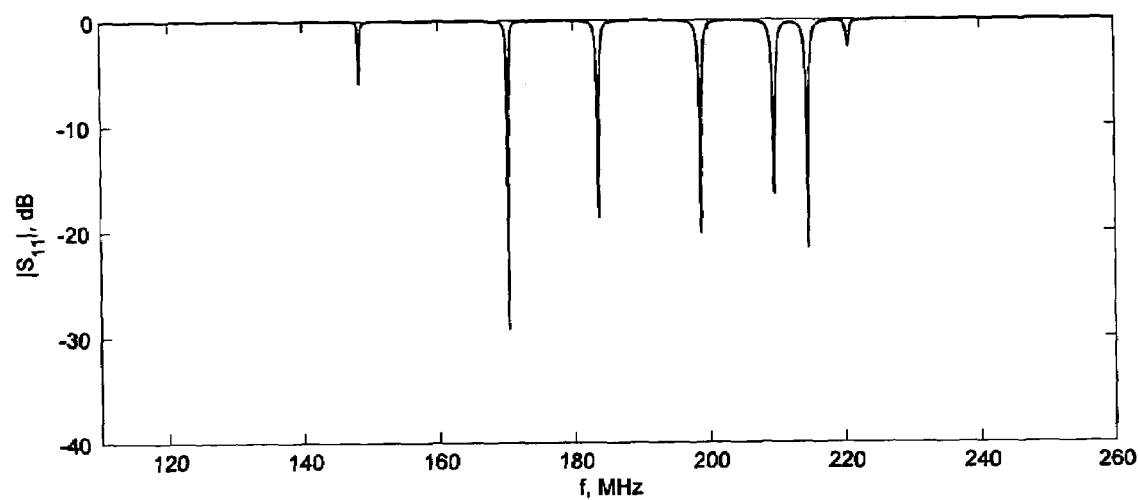
FIG. 11A shows a reflection coefficient ($S_{11}$) as a function of frequency for a dual-tuned, single layer resonator volume coil n accordance with the fourth embodiment of the present invention and at a higher frequency of operation.
Figure 11B:
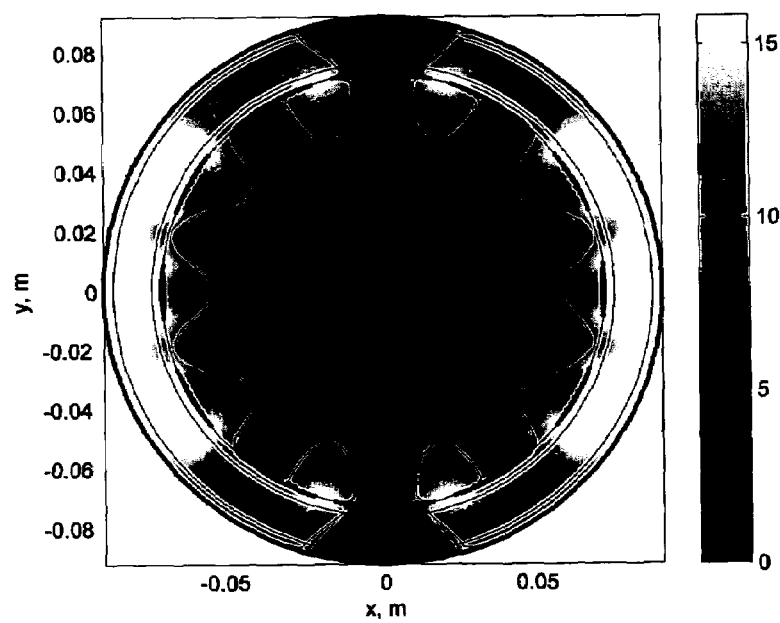
FIG. 11B shows the $B_1$ field behavior for the dual-tuned, single layer resonator volume coil in accordance with the fourth embodiment, at the higher frequency of operation.

FIGS. 10B and 11B show cross-sections of such an embodiment. As can be seen, the widths of the coil strips vary as a function of their location. In an exemplary embodiment, the strip widths vary sinusoidally from their nominal width, with the width of the strips at the 0° and 180° positions being −30% of the nominal width, and the width of the strips at the 90° and 270° positions being +30% of the nominal width.

As in the above described embodiments, capacitors (not shown) are coupled between each strip of the coil and an outer cylindrical shield. In an exemplary embodiment, the values of the capacitors vary sinusoidally as a function of the position of their corresponding strip. In an exemplary embodiment, the capacitors of the strips at the 0° and 180° positions are −17.6% of the nominal capacitance, and the capacitors of the strips at the 90° and 270° positions are +17.6% of the nominal capacitance.

An exemplary embodiment of the coil has the following parameters:

Shield Support Cylinder
OD=7.25 in (184 mm)
ID=7 in (178 mm)
Wall thickness=0.125 in (3.2 mm)
Material=acrylic Coil Support Cylinder
OD=6 in (152 mm)
ID=5.75 in (146 mm)
Wall thickness=0.125 in (3.2 mm)
Material=acrylic Coil length=5 in (127 mm)

Number of strips=12

Nominal strip width=1.018 in (25.8 mm or 67.6% of center-to-center spacing)

The operating frequencies are as follows:
$f_{low}$=160.8 MHz
$f_{high}$=170.2 MHz Table II summarizes the results of simulations for the aforementioned embodiment and the reference coil.

TABLE II

| | Lower frequency | | | | Higher frequency | | | |
|---|---|---|---|---|---|---|---|---|
| Coil Type | Q | $B_1$, $\mu T/\sqrt{W}$ | Normalized $B_1$, $\mu T/\sqrt{Q \cdot W}$ | $B_1 \pm 1$ dB diameter, mm | Q | $B_1$, $\mu T/\sqrt{W}$ | Normalized $B_1$, $\mu T/\sqrt{Q \cdot W}$ | $B_1 \pm 1$ dB diameter, mm |
| Dual tuned, single coil | 679 | 5.52 | 0.212 | 108 | 699 | 5.19 | 0.196 | 104 |
| Reference single-tuned linear | 693 | 5.48 | 0.208 | 111 | 697 | 5.35 | 0.203 | 111 |

The performance of an exemplary embodiment of the dual-tuned, single layer coil of the present invention will now be described.

In this exemplary embodiment, the capacitor values and strip widths are as follows:

C(nominal)=26.4 pF
C variation=sinusoidal: −17.6% at 0° and 180°, +17.6% at 90° and 270°
Strip width=1.004 in (25.5 mm or 66.7% of center-to-center spacing)
Strip width variation=sinusoidal: −30% at 0° and 180°, +30% at 90° and 270°

For the lower frequency (e.g., 160.8 MHz) of operation of this embodiment:
Q=679
B1=5.52 uT/sqrt(W)
B1(Q-normalized)=0.212 uT/sqrt(Q*W)
B1±1 dB diameter=108 mm FIG. 10A shows the reflection coefficient ($S_{11}$) as a function of frequency for this embodiment, at the lower frequency of operation FIG. 10B shows the $B_1$ field behavior (black contour: ±1 dB boundary) for the same embodiment, at the lower frequency of operation.

For the higher frequency (e.g., 170.2 MHz) of operation of this embodiment:
Q=699
B1=5.19 uT/sqrt(W)
B1(Q-normalized)=0.196 uT/sqrt(Q*W)
B1±1 dB diameter=104 mm FIG. 11A shows the reflection coefficient ($S_{11}$) as a function of frequency for this embodiment, at the higher frequency of operation FIG. 11B shows the $B_1$ field behavior (black contour: ±1 dB boundary) for the same embodiment, at the higher frequency of operation.

For comparison, the performance of the single-tuned reference coil will now be described.

For the lower frequency (e.g., 160.8 MHz) of operation, the value of the capacitors used is 30.0 pF, and the resultant parameters are:
Q=693
B1=5.48 uT/sqrt(W)
B1(Q-normalized)=0.208 uT/sqrt(Q*W)
B1±1 dB diameter=111 mm (linear)

FIG. 12A shows the reflection coefficient ($S_{11}$) as a function of frequency for the reference coil operating at the lower frequency of operation, whereas FIG. 12B shows the $B_1$ field behavior.

For the higher frequency (e.g., 170.2 MHz) of operation, the value of the capacitors used is 24.9 pF, and the resultant parameters are:
Q=697
B1=5.35 uT/sqrt(W)
B1(Q-normalized)=0.203 uT/sqrt(Q*W)
B1±1 dB diameter=111 mm (linear)

FIG. 13A shows the reflection coefficient ($S_{11}$) as a function of frequency for the reference coil operating at the higher frequency of operation, whereas FIG. 13B shows the $B_1$ field behavior.

Having described embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A dual-tuned volume coil for performing MR imaging comprising: an inner cylinder having a first coil structure disposed on an inner surface thereof and a second coil structure disposed on an outer surface thereof, wherein the first coil structure operates at a first resonance frequency and the second coil structure operates at a second resonance frequency; and an outer shield disposed about the inner cylinder, with the first and second coil structure being connected to the outer shield by means of a plurality of capacitors.

2. The volume of claim 1, wherein the first coil structure includes a plurality of first microstrips coupled to the inner surface and the second coil structure includes a plurality of second microstrips.

3. The volume coil of claim 1, wherein the first coil structure operates at a lower frequency than the second coil structure.

4. The volume coil of claim 1, wherein the first coil structure operates at a high frequency than the second coil structure.

5. The volume coil of claim 1, wherein the first coil structure operates at a lower frequency than the second coil structure and the first coil structure extends beyond the second coil structure.

6. The volume coil of claim 5, wherein the first coil structure includes a plurality of first microstrips coupled to the inner surface and the second coil structure includes a plurality of second microstrips, the first microstrips extending beyond both ends of the second microstrips.

7. The volume coil of claim 1, wherein at least one of the first and second resonance frequencies is an atom resonance frequency selected from the group consisting of phosphorous, fluoride and carbon.

8. A dual-tuned volume coil comprising: a single inner coil structure having a first set of microstrips and a second set of microstrips, spaced from the first set of microstrips, the first and second sets of microstrips operating at two different resonance frequencies to provide two imaging modes; and an outer shield that is electrically coupled to the inner coil structure, wherein widths of the microstrips vary as a function of their location about the coil.

9. The volume coil of claim 8, wherein the widths of the microstrips have a nominal width and the microstrips vary sinusoidally from the nominal width.

10. The volume coil of claim 8, wherein the microstrips are electrically coupled to the outer shield by means of capacitors.

11. A dual-tuned volume coil comprising:
a single inner coil structure having a plurality of microstrips that operate at two different resonance frequencies to provide two imaging modes, the microstrips being divided into a first set of microstrips that operate at one resonance frequency and a second set of microstrips that operate at a different resonance frequency, the first set of microstrips being spaced radially outward from the second set of microstrips, the first and second sets of microstrips providing two imaging modes; and
an outer shield that is electrically coupled to the inner coil structure.

12. The volume coil of claim 11, wherein the first and second sets of microstrips are concentric with respect to one another.

13. A dual-tuned volume coil comprising:
a single inner coil structure having a plurality of microstrips that operate at two different resonance frequencies to provide two imaging modes, the microstrips being divided into a first set of microstrips that operate at one resonance frequency and a second set of microstrips that operate at a different resonance frequency for providing two imaging modes, the second set of microstrips being offset from the first set of microstrips such that at least portions of the second set of microstrips is axially aligned with spaces formed between the microstrips of the first set; and
an outer shield that is electrically coupled to the inner coil structure.

14. The volume coil of claim 13, wherein the first and second sets of microstrips are concentric to one another, with the first set of microstrips being spaced radially outward from the second set of microstrips.

* * * * *